United States Patent
Yano

(10) Patent No.: US 9,196,366 B2
(45) Date of Patent: Nov. 24, 2015

(54) SEMICONDUCTOR MEMORY APPARATUS AND METHOD FOR ERASING THE SAME

(71) Applicant: Winbond Electronics Corp., Taichung (TW)

(72) Inventor: Masaru Yano, Tokyo (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/029,807

(22) Filed: Sep. 18, 2013

(65) Prior Publication Data

US 2015/0078097 A1 Mar. 19, 2015

(51) Int. Cl.
G11C 16/26 (2006.01)
G11C 11/34 (2006.01)
G11C 16/14 (2006.01)

(52) U.S. Cl.
CPC ............... *G11C 16/14* (2013.01); *G11C 16/26* (2013.01)

(58) Field of Classification Search
CPC ................................ G11C 11/34; G11C 16/26
USPC .............. 365/185.11, 185.17, 185.18, 185.25
See application file for complete search history.

(56) References Cited

U.S. PATENT DOCUMENTS

| | | | | |
|---|---|---|---|---|
| 6,483,752 | B2 * | 11/2002 | Hirano | 365/185.33 |
| 7,697,333 | B2 | 4/2010 | Isobe | |
| 2003/0147279 | A1 | 8/2003 | Pan et al. | |
| 2008/0043533 | A1 * | 2/2008 | Isobe | 365/185.17 |
| 2008/0247254 | A1 * | 10/2008 | Nguyen et al. | 365/212 |
| 2010/0271877 | A1 * | 10/2010 | Aritome | 365/185.03 |
| 2010/0309725 | A1 * | 12/2010 | Huh | 365/185.12 |
| 2011/0235420 | A1 * | 9/2011 | Sharon et al. | 365/185.17 |
| 2014/0003149 | A1 * | 1/2014 | Maejima | 365/185.17 |
| 2014/0063950 | A1 * | 3/2014 | Baek et al. | 365/185.11 |

FOREIGN PATENT DOCUMENTS

| | | |
|---|---|---|
| JP | H11-176177 | 7/1999 |
| JP | 2005235260 | 9/2005 |
| JP | 2006523911 | 10/2006 |
| JP | 2007172775 | 7/2007 |

(Continued)

OTHER PUBLICATIONS

"Office Action of Korean Counterpart Application", issued on May 15, 2015, with English translation thereof, p. 1-p. 6, in which the listed reference was cited.

(Continued)

*Primary Examiner* — Hoai V Ho
*Assistant Examiner* — Muna A Techane
(74) *Attorney, Agent, or Firm* — Jianq Chyun IP Office

(57) ABSTRACT

A flash memory with low power consumption and rapid operations is disclosed, including a memory array of memory cells, a word line selection circuit for selecting a row of cells, a current-type sensing circuit electrically connected with each bit line for sensing the current of a selected bit line, and an erase unit erasing the cells in a selected block of the array. The erase unit includes: an erase sequence that determines whether the current of each bit line in the erased block is larger than a first value and ends the erasure if the result is "yes", and a soft-program sequence that performs a soft program verification, which applies a soft-program voltage to all word lines in the erased block and determines whether the current of each bit line is lower than a second value, and ends the soft programming if the result is "yes".

8 Claims, 8 Drawing Sheets

(56) References Cited

FOREIGN PATENT DOCUMENTS

| | | |
|---|---|---|
| JP | 2007305204 | 11/2007 |
| JP | 2009230818 | 10/2009 |
| JP | 2011076678 | 4/2011 |
| KR | 20000019968 | 4/2000 |
| WO | 2011119500 | 9/2011 |

OTHER PUBLICATIONS

"Office Action of Japan Counterpart Application", issued on Feb. 19, 2014, with English translation thereof, pp. 1-6, in which the listed references were cited.

* cited by examiner

| | Erase | Write | Read |
|---|---|---|---|
| Selected word line | 0 | 15~20V | 0 |
| Non-select word line | F | 10V | 4.5 |
| SGD | F | Vcc | 4.5 |
| SGS | F | 0 | 4.5 |
| SL | F | Vcc | 0 |
| P-well | 21 | 0 | 0 |

SEMICONDUCTOR MEMORY APPARATUS AND METHOD FOR ERASING THE SAME

BACKGROUND

1. Field of the Invention

The invention relates to a semiconductor memory apparatus, and more particularly to a semiconductor memory apparatus that reads data of a (NAND) flash memory in a current sensing manner, and a method for erasing the semiconductor memory apparatus.

2. Description of Related Art

FIG. 1 illustrates an example of a bit line selection circuit and a page buffer/sensing circuit of a conventional flash memory, in which a pair of bit lines including an even bit line GBL_e and an odd bit line GBL_o is exemplarily illustrated. The bit line selection circuit 10 includes an even select transistor SEL_e electrically connected with the even bit line GBL_e and an odd select transistor SEL_o electrically connected with the odd bit line GBL_o, an even bias select transistor YSEL_e electrically connected between the even bit line GBL_e and a virtual potential VIR, an odd bias select transistor YSEL_o electrically connected between the odd bit line GBL_o and the virtual potential VIR, and a bit line select transistor BLS electrically connected with a common node N1 which is electrically connected with the even select transistor SEL_e and the odd select transistor SEL_o.

Each of the even bit line GBL_e and the odd bit line GBL_o is electrically connected with a NAND string NU. Each NAND string NU includes a plurality of memory cells connected in series along the column direction and a drain select transistor and a source select transistor electrically connected with two ends thereto. The drain select transistor is electrically connected with the even bit line GBL_e or the odd bit line GBL_o, and the source select transistor is electrically connected with a common source line SL.

A sensing circuit 20 has a pre-charge transistor BLPRE for providing a pre-charge potential to each bit line, a capacitor C electrically connected with a sense node SN formed between the pre-charge transistor BLPRE and the bit line select transistor BLS, and a transfer transistor BLCD transferring the potential of the sense node SN to a latch circuit 22.

When the even bit line GBL_e is selected but the odd bit line GBL_o is not, the even select transistor SEL_e and the bit line select transistor BLS are turned on, and the odd select transistor SEL_o is turned off. When the odd bit line GBL_o is selected but the even bit line GBL_e is not, the odd select transistor SEL_o and the bit line select transistor BLS are turned on, and the even select transistor SEL_e is turned off. By doing so, one sensing circuit 20 is shared by two 2 bit lines, i.e., the bit lines GBL_e and GBL_o.

When the even bit line GBL_e is selected but the odd bit line GBL_o is not in a read operation, the even bias select transistor YSEL_e is turned off, the odd bias select transistor YSEL_o is turned on, and the odd bit line GBL_o is provided with a ground potential from the virtual potential VIR. Otherwise, when the even bit line GBL_e is not selected but the odd bit line GBL_o is, the even bias select transistor YSEL_e is turned on, the odd bias select transistor YSEL_o is turned off, and the even bit line GBL_e is provided with the ground potential from the virtual potential VIR. By providing the odd bit line with the ground potential when reading the even bit line and providing the even bit line with the ground potential when reading the odd bit line in this way, a bit line shielding effect may be provided to mitigate the noise occurring due to the capacitive coupling between the neighboring bit lines, as described in Japan Patent Publication No. Hei 11-176177.

The sensing circuit 20 illustrated in FIG. 1 is a so-called voltage-type sensing circuit, in which the pre-charge potential is provided to the even bit line GBL_e or the odd bit line GBL_o by the pre-charge transistor BLPRE. Then, the sensing circuit 20 discharges the bit line corresponding to the storage state of the selected memory cell and detects the discharging state at the sensing node SN. However, when a decrease of the bit line linewidth results in increase of the resistance of the bit lines and an increase of the number of the memory cells constituting the NAND string results in an increase of the capacitance between the bit lines, the time constant of the voltage-type sensing circuit is increased and the time for charging/discharging the bit lines is longer, so that the time for reading the data is prolonged. Thus, the voltage-type sensing circuit is no longer applicable to a highly integrated flash memory.

In light of the foregoing, currently used sensing circuits utilize current sensing instead. A current-type sensing circuit detects the cell current of a memory cell corresponding to the storage state through the bit line. Compared with the voltage-type, the current-type sensing circuit is capable of achieving high-speed sensing. The current-type sensing circuit may utilize, for example, a cascode circuit performing current-voltage conversion, or the like.

However, the conventional current-type sensing circuit has the following issues. In a flash memory, electrons are accumulated in the floating gate at programming to positively shift the threshold voltage of the memory cell, and the electrons are ejected from the floating gate at erasure to negatively shift the threshold voltage of the memory cell. However, in the programming or erasure, the threshold voltage of the memory cell has to be controlled within the distribution range of the "0" or "1" storage state, or within the distribution range of the "00", "01", "10" or "11" storage state when the memory cell stores multi-bit data. In order to accurately control the threshold voltage of the memory cell, an incremental step pulse erase (ISPE) mode is adopted, where an initiate erase pulse Vers0 is applied to the memory cells in a selected block, and when the erasure is determined to be unsuccessful by erase verification, an erase pulse Vers1 higher than the erase pulse Vers0 by an increment is applied, and the voltage of the erase pulse is gradually increased until the erasure of all memory cells in the block is determined to be successful.

Due to factors such as the size or shape of each memory cell varying with the variation of manufacturing process parameters and deterioration of the tunnel oxide layer resulted from a large number of program/erase cycles, each memory cell differs from one another in being more easily or uneasily erased. In details, some memory cells have high conductance that allows the currents to flow more easily, while some memory cells have low conductance that the currents are less likely to flow. Since the erase verification does not determine the erase states of the memory cells one by one but determines whether the erasure of the entire block is successful with each bit line as a unit, when a bit line is simultaneously connected with memory cells having high conductance and memory cells having low conductance, the memory cells having low conductance become the base for determining whether the erasure is successful, such that the memory cells having high conductance would be over-erased. Therefore, when reading data, the over-erased memory cells have relatively large currents, therefore increasing the power-consumption. In the meantime, the sensing circuit also has to provide a large current, which limits the minimization of the sensing circuit.

SUMMARY

Accordingly, the invention provides a semiconductor memory apparatus capable of reducing the power consumption and being operated at a high speed.

The invention also provides a method for erasing a semiconductor memory apparatus having NAND non-volatile memory cells.

The semiconductor memory apparatus of the invention includes a memory array having a plurality of memory cells, a word line selection circuit configured for selecting a row of memory cells, a current-type sensing circuit electrically connected with each bit line of the memory array for sensing the current of a selected bit line, and an erase unit for erasing data in the memory cells of the selected block of the memory array. The erase unit includes an erase sequence and a soft-program sequence. The erase sequence includes an erase verification of determining whether the current of each bit line in the erased block is larger than a first value, and ends the erasure if the result is "yes". The soft-program sequence includes a soft-program verification that applies a soft-program voltage to all the word lines in the erased block and determines whether the current of each bit line is lower than a second value which is lower than the first value, and ends the soft programming if the result is "yes".

In an embodiment of the invention, the soft-program verification applies, to all word lines, a bias voltage that is applied to non-selected word lines in a read operation, and determines whether the current of each bit line is lower than the second value. The soft-program sequence may apply a write protection voltage to the bit lines whose currents are lower than the second value and perform the soft programming on the memory cells electrically connected with the bit lines whose currents are larger than the second value.

In an embodiment of the invention, the semiconductor memory apparatus further includes a plurality of pre-charge circuits. Each of the pre-charge circuits provides a pre-charge voltage to the bit lines and is configured between the blocks. Each of the pre-charge circuits provides the pre-charge voltage to the bit lines before the currents are supplied to the bit lines through the sensing circuit. The sensing circuit includes a first sensing circuit electrically connected with the even bit lines and a second sensing circuit electrically connected with the odd bit lines. The first sensing circuit is disposed beside one end of the memory array, the second sensing circuit is disposed beside the other end of the memory array, and the plurality of pre-charge circuits is disposed between the first sensing circuit and the second sensing circuit. Each of the pre-charge circuits includes a conductive line extending along the row direction of the memory array from the word line selection circuit and electrically connected with the bit lines.

The method for erasing a semiconductor memory apparatus having NAND non-volatile memory cells of the invention includes an erase sequence and a soft-program sequence. The erase sequence includes an erase verification of determining whether the current of each bit line in the erased block is larger than a first value, and ends the erasure if the result is "yes". The soft-program sequence includes a soft-program verification that applies a soft-program voltage to all the word lines in the erased block and determines whether the current of each bit line is lower than a second value which is lower than the first value, and ends the soft programming if the result is "yes".

With the invention, a semiconductor memory apparatus using a current-type sensing circuit to achieve power-consumption reduction and a high-speed operation can be provided.

In order to make the aforementioned and other features and advantages of the invention more comprehensible, several embodiments accompanied with figures are described in detail below.

DESCRIPTION OF EMBODIMENTS

The flash memory of the invention utilizes a current-type sensing circuit to determine whether a current flows through a memory cell. In order to reduce the power consumption in reading, a scheme capable of controlling negative threshold voltages of the memory cells higher than or equal to a certain value is adopted to erase the data of the memory cells. Thereby, the currents provided by the current-type sensing circuit to the bit lines can be suppressed under a certain value to reduce the power consumption. Embodiments of the invention will be described in detail in reference to the accompanying drawings. It is particularly noted that some elements are emphasized for better understanding, which have size scales different from those of the actual ones.

Figure 1:
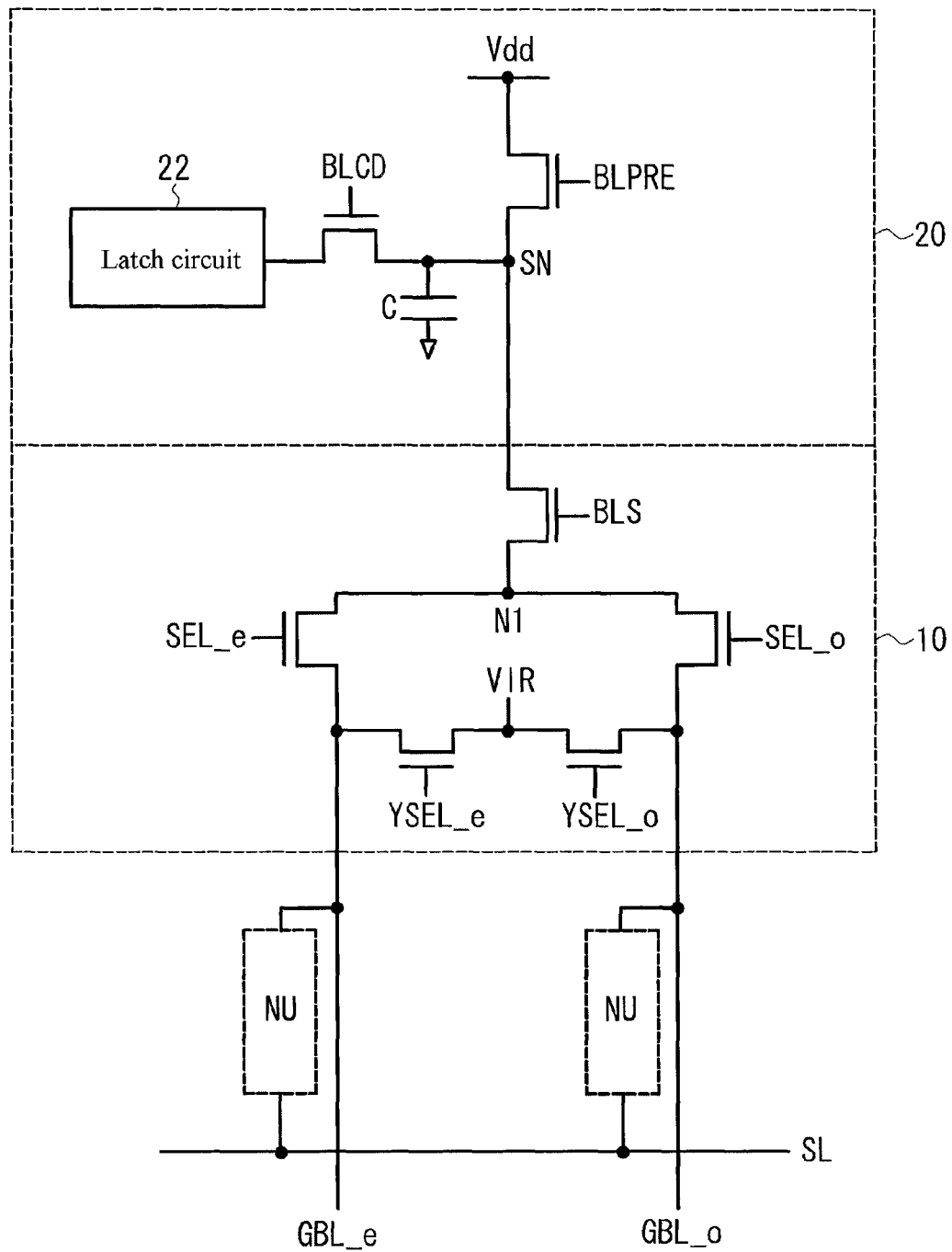
FIG. 1 illustrates an example of a bit line selection circuit and a page buffer/sensing circuit of a conventional flash memory
Figure 2:
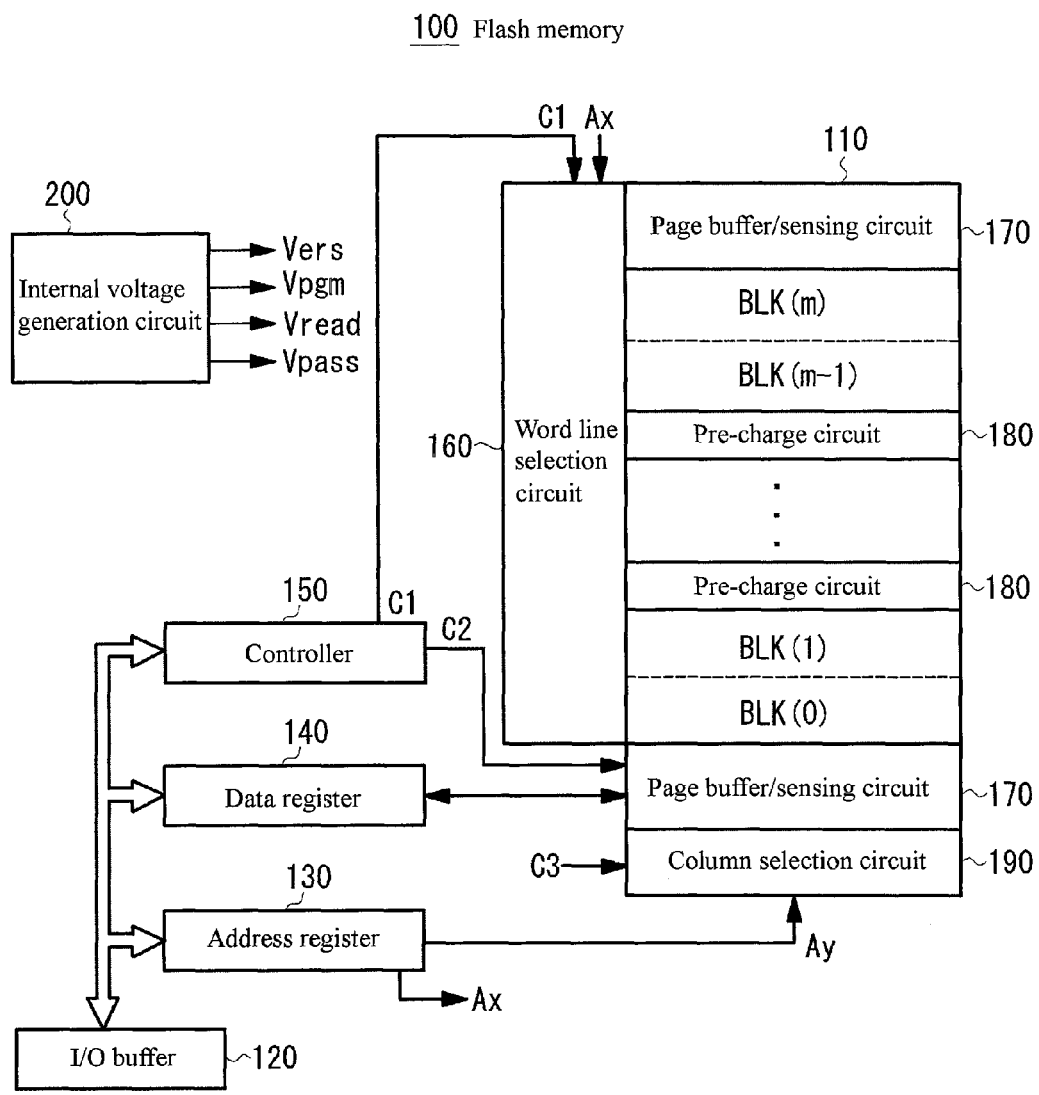
FIG. 2 is a block diagram illustrating an exemplary structure of a flash memory according to an embodiment of the invention.

FIG. 2 is a block diagram illustrating an exemplary structure of a flash memory according to an embodiment of the invention. The exemplary structure is simply an example, but is not intended to restrict the scope of the invention.

The flash memory 100 of the exemplary embodiment of the invention includes a memory array 110 having a plurality of memory cells arranged in rows and columns, an input/output (I/O) buffer 120 for saving input/output (I/O) data, which is electrically connected with an external I/O terminal, an address register 130 for obtaining address data from the I/O buffer 120, a data register 140 for saving the I/O data, a controller 150 for providing control signals C1, C2 and C3 configured to control each element based on instruction data from the I/O buffer 120 and external control signals (not shown, which are chip enable or address latch enable), a word line selection circuit 160 for selecting blocks and word lines based on the decoding results of the row address information Ax from the address register 130, page buffer/sensing circuits 170 configured to save the data read from a page selected by the word line selection circuit 160 and the write data of the selected page, pre-charge circuits 180 for providing a pre-charge voltage to the bit lines, a column selection circuit 190 for selecting the column data in the page buffer/sensing circuit 170 based on the decoding results of the column address information Ay from the address register 130, and an internal voltage generation circuit 200 configured to generate voltages required for data reading, programming and erasure (e.g., a program voltage Vpgm, a pass voltage Vpass, a read pass voltage Vread, an erase voltage Vers, a soft-program voltage Vsoft and a non-selection read voltage VPASSR).

The memory array 110 has a plurality of blocks BLK(0), BLK(1), ... and BLK(m) disposed along the column direction, the page buffer/sensing circuit 170 are disposed at two sides of the blocks, and a plurality of pre-charge circuits 180 are disposed along the column direction of the blocks.

Figure 3:
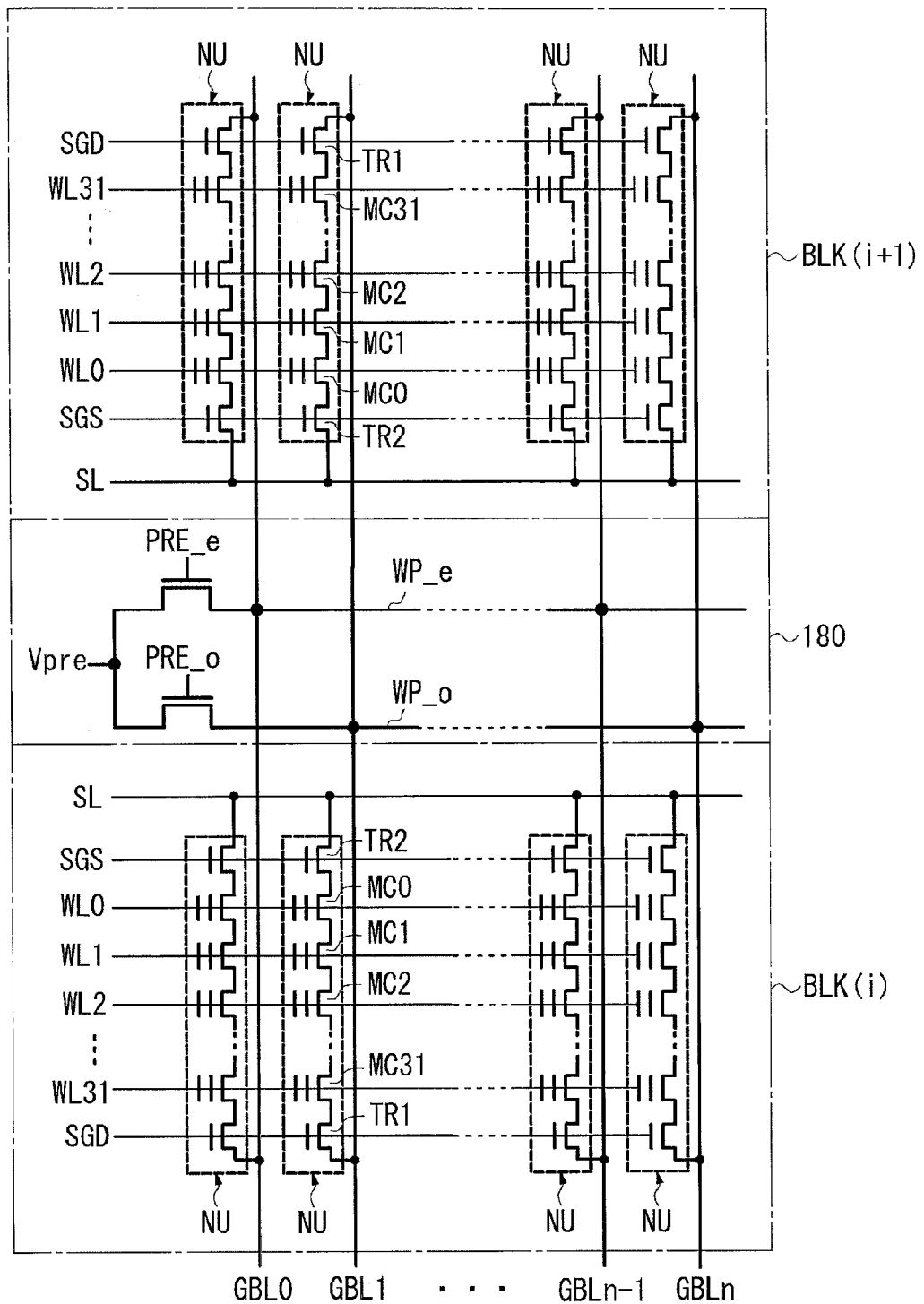
FIG. 3 illustrates a circuit diagram of the pre-charge circuits and the NAND string structures according to an embodiment of the invention.

FIG. 3 exemplarily illustrates NAND string structures formed in the memory blocks and a pre-charge circuit disposed between the blocks. Each of the memory blocks has a plurality of NAND strings NU formed therein, each of which includes a plurality of memory cells connected in series in the column direction. In the example illustrated in FIG. 3, there are n+1 NAND strings NU arranged along the column direction in one memory block.

Each NAND string NU includes a plurality of memory cells MCi (i=0, 1, . . . , 31) connected in series along the column direction, a select transistor TR1 electrically connected with the drain side of the memory cell MC31 at one end thereof, and a select transistor TR2 electrically connected with the source side of the memory cell MC0 at the other end thereof. The drain of the select transistor TR1 is electrically connected with a corresponding bit line GBL, and the source of the select transistor TR2 is electrically connected with a common source line SL.

The control gate of the memory cell MCi is electrically connected with a word line WLi, the gates of the select transistors TR1 and TR2 are electrically connected with selection gate lines SGD and SGS, respectively, that are parallel to the word lines WL. When the memory blocks are selected based on the row address information Ax, the word line selection circuit 160 selectively drives the select transistor TR1 or TR2 with a signal from the selection gate lines SGD or SGS of the memory block.

Generally, P-wells are formed in a semiconductor substrate and a semiconductor layer, and a block is formed in each P-well. Each memory cell has a MOS structure, including a source and a drain as N-type diffusions, a tunnel oxide layer on a channel region between the source and the drain, a floating gate (or a charge storage layer) for storing charges on the tunnel oxide layer, and a control gate formed above the floating gate with a dielectric layer in between. When not storing charges or being erased, the floating gate is maintained in a "1" state and has a negative threshold voltage, such that the memory cell is in a normally On state. When storing charges or being programmed, the floating gate is maintained in a "0" state and has a positive threshold voltage, such that the memory cell is in a normally Off state.

Moreover, as shown in FIG. 3, a pre-charge circuit 180 is inserted between the block BLK(i) and the block BLK(i+1) to provide a pre-charge voltage to each bit line GBL. The pre-charge circuits 180 may be inserted in any position and in any number, but is preferably so disposed that the number of the blocks included between a pre-charge circuit 180 and a page buffer/sensing circuit 170 is approximate to the number of the blocks between the pre-charge circuits 180. With the disposition of the pre-charge circuits 180, the time required for pre-charging the bit lines may be shortened.

In a preferred embodiment, the pre-charge circuit 180 includes an even pre-charge transistor PRE_e electrically connected with the even bit lines GBL_e, and an odd pre-charge transistor PRE_o electrically connected with the odd bit lines GBL_o. The even pre-charge transistor PRE_e and the odd pre-charge transistor PRE_o are formed within the word line selection circuit 160 and are operated based on the control signals from the controller 150. Metal wires WP_e and WP_o which are electrically connected with the even pre-charge transistor PRE_e and the odd pre-charge transistor PRE_o respectively extend along the row direction of the memory array 110. The metal wire WP_e is electrically connected with the even bit lines GBL_e, and the metal wire WP_o is electrically connected with the odd bit lines GBL_o. The metal wires WP_e and WP_o preferably extend to a place over the common source line SL. When a read operation is performed, the even pre-charge transistor PRE_e or the odd pre-charge transistor PRE_o, for example, is turned on to provide a pre-charge potential Vpre to the even bit lines GBL_e or the odd bit lines GBL_o.

The bit lines GBL0, GBL1, . . . and GBLn are electrically connected with the NAND strings NU are electrically connected with the page buffer/sensing circuit 170 via a bit line selection circuit. During the read or program operation, the bit line selection circuit selects an even or odd bit line to be electrically connected with the page buffer/sensing circuit 170. For instance, when an even bit line is selected, the even bit line is electrically connected with the page buffer/sensing circuit 170 at the upper part of the memory array 110 in FIG. 2. When an odd bit line is selected, the odd bit line is electrically connected with the page buffer/sensing circuit 170 at the lower part of the memory array 110 in FIG. 2.

Figures 4, 5:
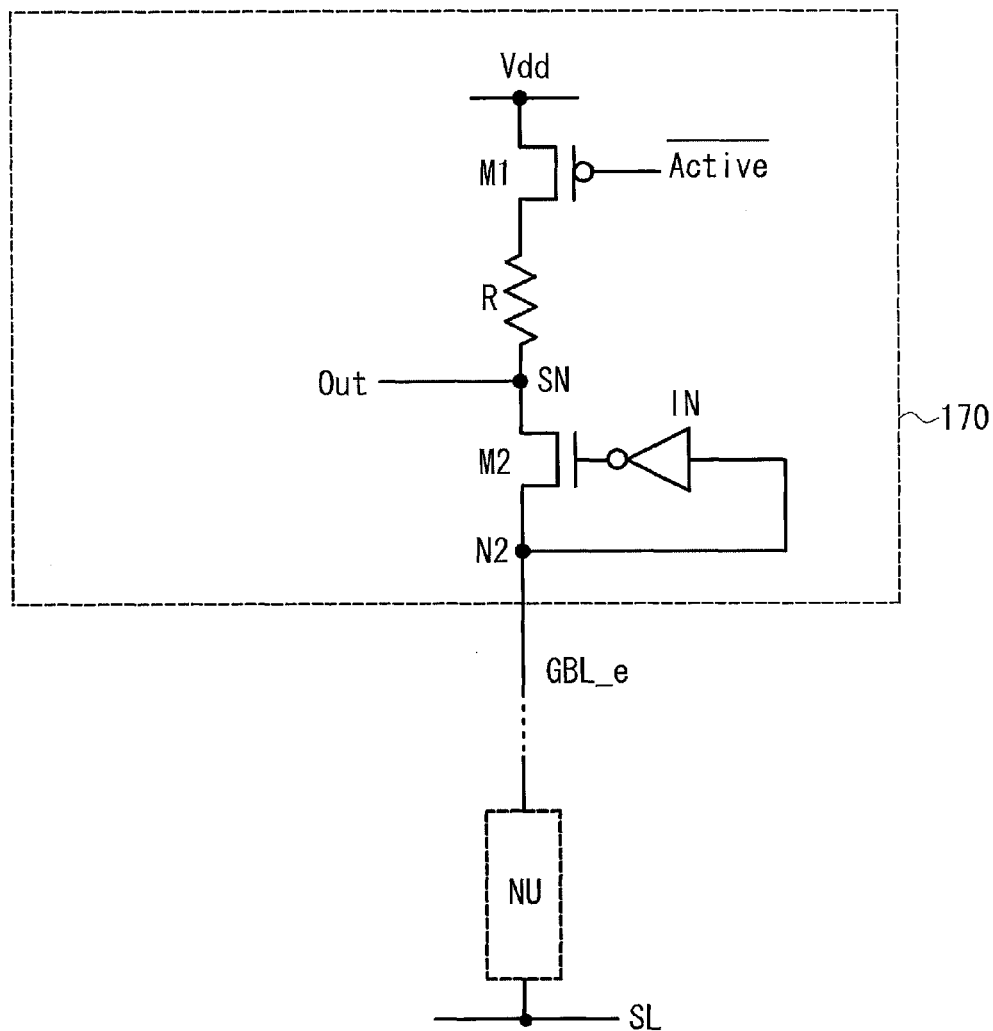
FIG. 4 illustrates an exemplary structure of a page buffer/sensing circuit according to an embodiment of the invention.
FIG. 5 lists a voltage relationship between the elements of the flash memory according to an embodiment of the invention at each operation mode.

FIG. 4 illustrates a circuit diagram of an exemplary structure of a page buffer/sensing circuit according to an embodiment of the invention, with the page buffer/sensing circuit 170 electrically connected with one even bit line GBL_e as an example. The page buffer/sensing circuit 170 includes a sensing circuit detecting a current of the even bit line GBL_e in the reading and a latch circuit saving the read data or data obtained in the programming.

The sensing circuit of this embodiment is a current-type and may be formed by well-known circuits. Though FIG. 4 merely illustrates a simplified cascode circuit, a circuit equipped with a reference cascode circuit and configured to amplify a signal converted through a current-voltage conversion by using a differential amplification circuit based on two cascode circuits may also be used. The sensing circuit depicted in FIG. 4 includes a P-channel metal oxide semiconductor (PMOS) transistor M1 electrically connected with a power supply Vdd, a resistor R electrically connected with the PMOS transistor M1 in the column direction, a N-channel metal oxide semiconductor (NMOS) transistor M2 electrically connected with the resistor R in the column direction, and a CMOS inverter IN connected with the gate of the NMOS transistor M2.

A signal "Active" for turning on the sensing circuit is input to the gate of the transistor M1, such that the transistor M1 functions as a power source. The gate of the transistor M2 is electrically connected to the output of the inverter IN, such that the inverter IN applies a reversal potential of the bit line GBL_e on the transistor M2. That is, the node N2 is electrically connected with the even bit line GBL_e via the bit line selection circuit to detect the current of the even bit line GBL_e. If there is a current in the bit line GBL_e, the node N2 has a low potential and the transistor M2 is turned on, such that a detection current flows through the transistor M1 and is converted to a voltage (equal to the product of the resistance of the resistor R multiplied by the detection current flowing through the resistor R) by the resistor R, and the sensing node SN outputs a voltage corresponding to the detection current. If there is no current or a quite small current in the bit line GBL_e, the transistor M2 is turned off, such that no detection current flows through the resistor R and the output Out of the sensing node SN is zero. Additionally, a shield reading operation, which makes the odd bit line have a reference potential when the even bit line is read and makes the even bit line have a reference potential when the odd bit line is read, may also be performed. The current-type sensing circuit of this embodiment may limit the maximum current to below a predetermined level in operation to suppress the power consumption in the reading or verification, as described below.

Then, the flash memory operation of this embodiment is described. FIG. 5 shows exemplary bias configurations of voltages respectively applied in the erasure, the writing and the reading, in which F represents floating. After receiving an instruction with respect to reading, programming or erasure, the controller 150 controls the word line selection circuit 160, the line selection circuit 190, and the internal voltage generation circuit 200 to perform various operations.

Figure 6:
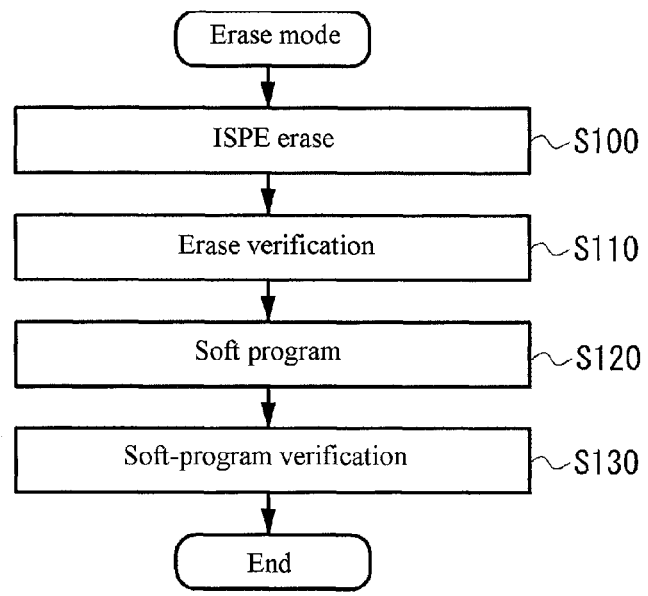
FIG. 6 illustrates a flowchart of a method for erasing a flash memory according to an embodiment of the invention.

The flash memory of this embodiment implements an erase operation containing a process illustrated in FIG. 6. After receiving an erase instruction, the controller 150 performs the erasure, as shown in FIG. 6. The erase operation includes an ISPE erase operation applying an erase pulse to a selected block to erase the data in the memory cells (step S100), an erase verification determining whether the threshold voltages of the memory cells are below an erase-verification voltage (step S110), a soft-program operation to narrow the distribution of the threshold voltages of the memory cells (step S120), and a soft-program verification (step S130).

Figure 7:
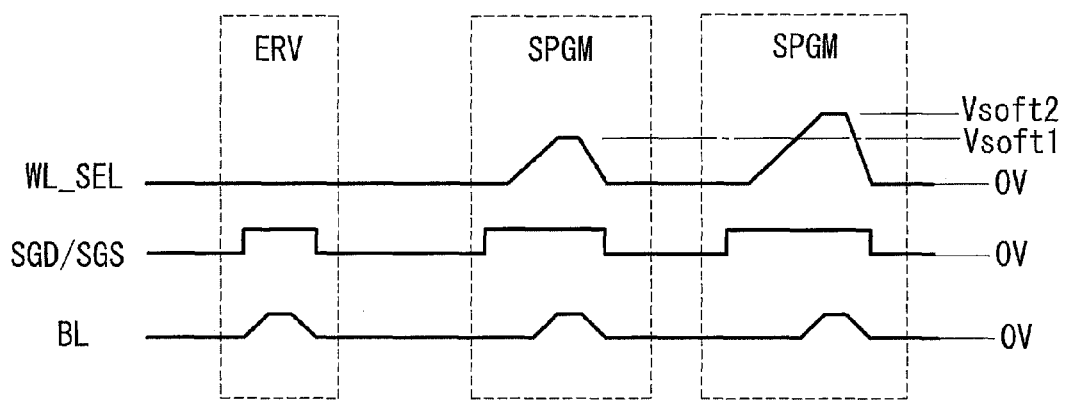
FIG. 7 illustrates a timing chart of the waveforms of the signals applied in the erase mode according to an embodiment of the invention.

FIG. 7 illustrates a timing chart of the waveforms of the signals applied in the erase verification (ERV) and the soft programming (SPGM). Typically, a flash memory is erased in a manner such that the data of all the memory cells in the selected block are erased in one time. The erasing method may include, for example, applying 0 V to all bit lines of the selected block, floating the selection gate lines SGD and SGS and applying an erase voltage Vers of about 20V to the P-well, under the control of the controller 150.

Then, the erase verification (ERV) is performed under the control of the controller 150, by which all word lines WL_SEL in the selected block is applied with 0 V and the selection gate lines SGD and SGS are applied with a power-supply voltage Vdd, and all the bit lines BL are applied with a voltage (e.g., 0.8 V) with the sensing circuit, as shown in FIG. 7. In the erase verification, when the pre-charge voltage Vpre is provided from the pre-charge circuit 180 to the bit lines and the bit lines are coupled to the sensing circuit 170, the voltage of the bit lines is not changed. That is, during a certain time period before the time point of the sensing circuit 170 being coupled to the bit lines, the even pre-charge transistor PRE_e or the odd pre-charge transistor PRE_o shown in FIG. 3 is turned on. Since the voltage variation at the time of the bit lines being coupled to the sensing circuit 170 is minimized, it may be expected that the pre-charge voltage Vpre is equal to the voltage provided by the sensing circuit 170.

Figure 8:
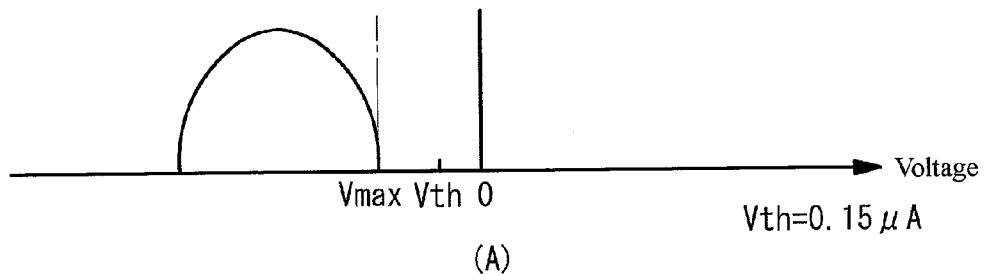
FIG. 8 illustrates the distribution states of threshold voltage in the erase verification, the soft-program verification and the page-program verification.
Figure 8:
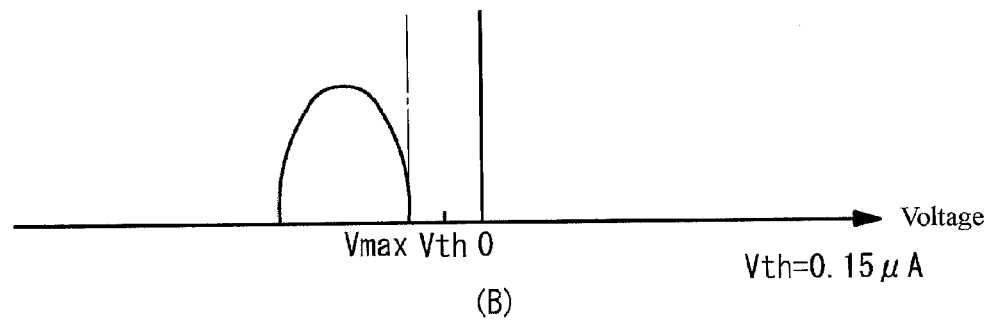
Figure 8:
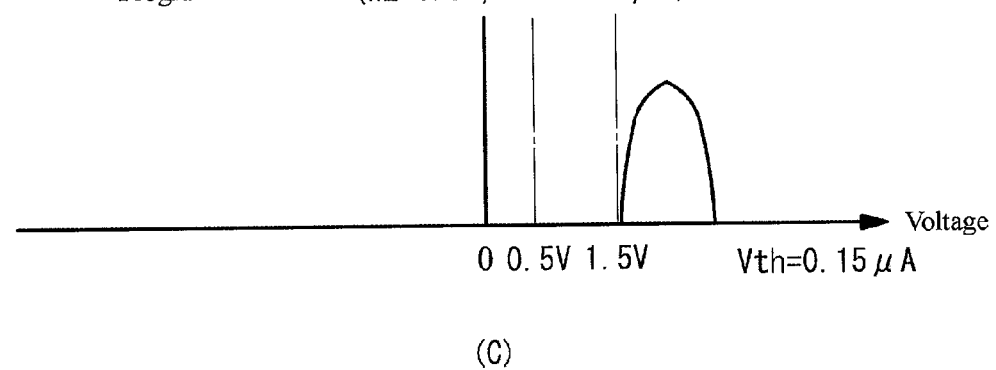

When the charges of the memory cells in the selected block are erased, the threshold voltage is negatively shifted, such that the memory cells are changed to "1" state. However, because there is difference between the memory cells due to deterioration of the tunnel oxide layer of the memory cells or the like, there is difference between the threshold voltages the memory cells. The erase verification is configured to determine whether the threshold voltage of a memory cell in the selected block is below a verify threshold voltage Vth. In this embodiment, since the sensing circuit 170 is a current type, the erasure is determined to be successful when the current of each of the bit lines is larger than or equal to a threshold current, such as 1 μA. When the sensing circuit shown in FIG. 4 senses that the current of the transistor M1 is larger than or equal to the threshold current, the sensing node SN presents a relatively high voltage corresponding to the threshold current. When the memory cells corresponding to the bit lines do not have any current or have a current lower than the threshold current, the sensing node SN presents a relatively low voltage. Whether the erasure is qualified may be determined based on the voltage output by the sensing node SN. If the erasure is determined to be unsuccessful, an erase pulse higher than the previously applied one by a certain value is applied to the P-well, such that the threshold voltage of the memory cells is further shifted negatively. Accordingly, by repeating the erasing and the erase verification until all the erasure are confirmed to be successful by the erasure verification, the maximum voltage Vmax of the threshold voltage distribution of the memory cells in the block is ensured to be below the verify threshold voltage Vth. FIG. 8A illustrates the threshold voltage distribution of the memory cells when the erase verification is ended. The maximum voltage Vmax of the threshold voltage distribution is lower than the threshold voltage corresponding to the erase-verification threshold current. The current of the memory cells referred to herein is a drain current Id capable of specifying the threshold voltage of the memory cells.

Then, a soft program/verification operation for narrowing the threshold voltage distribution of the memory cells is performed. Although the maximum voltage Vmax of the distribution is made to be lower than the threshold voltage Vth in the previously performed data erasure/erase verification, the minimum voltage Vmin of the distribution is not yet considered. Because the ISPE erasure/erase verification applies the erase pulse to the entire block for the memory cells through which a current is most difficult to flow, there are over-erased memory cells, i.e., memory cells whose threshold voltages have been overly negatively shifted, in the block. The soft programming referred to herein includes applying a soft-program voltage Vsoft1, which is lower than the voltage Vpgm ordinarily applied in a normal program operation, to provide a force for injecting charges into the memory cells to positively shift the threshold voltage.

Figure 9:
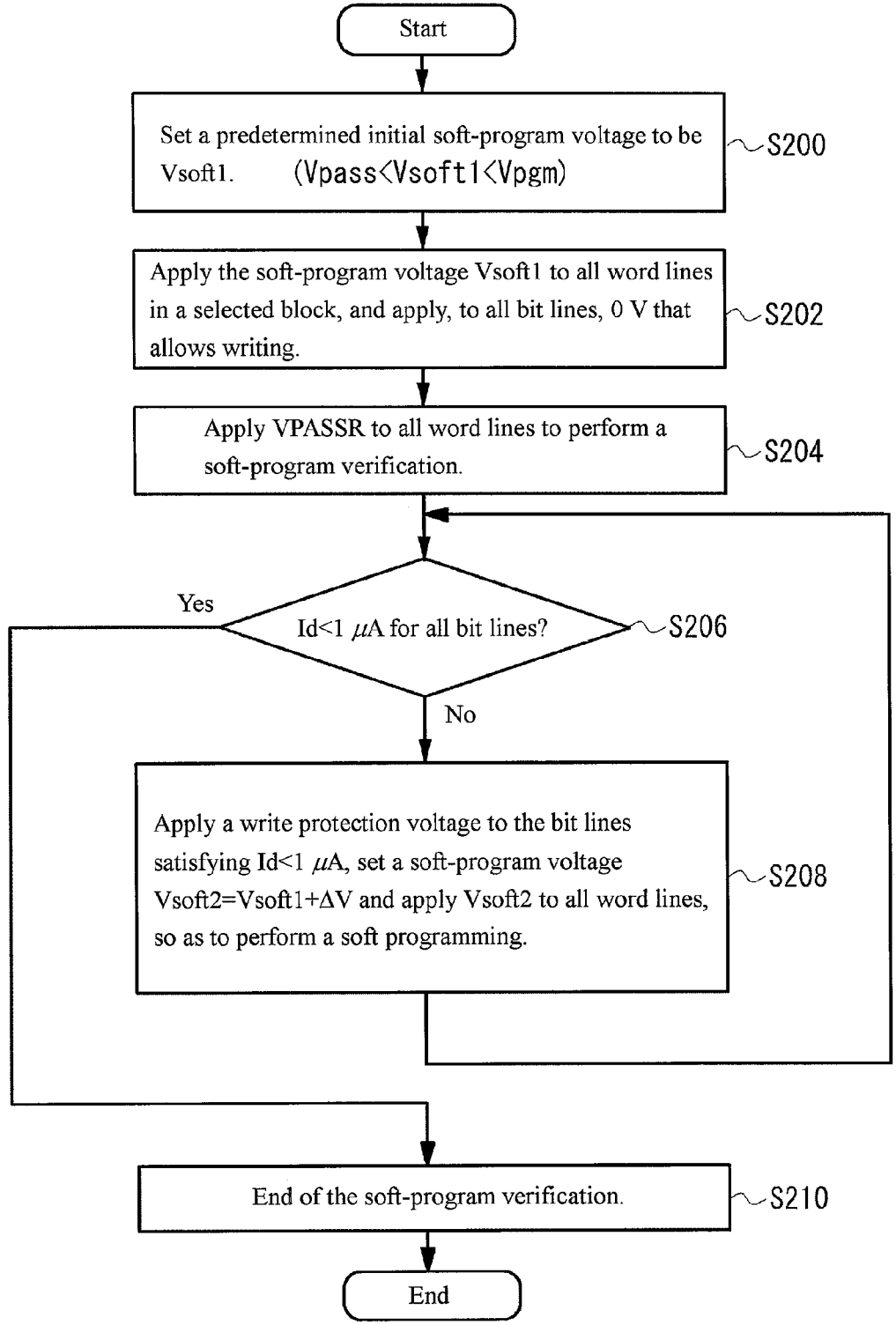
FIG. 9 illustrates a flow chart of a soft program/verification operation according to an embodiment of the invention.

FIG. 9 is a process flow of the soft program/verification operation of this embodiment. During the soft programming, a predetermined initiate soft-program voltage Vsoft1 is set for the memory (step S200), and, as shown in FIG. 7, the soft program voltage Vsoft1 is applied to all word lines in the selected block, the power supply voltage Vdd is applied to the selection gate lines SGD and SGS, and 0 V that allows writing is applied to all bit lines (step S202). At this time, the pre-charge circuit 180 likewise provides the pre-charge voltage Vpre to the bit lines as what is done in the erase verification. The soft-program voltage Vsoft1 is lower than an ordinary program voltage, such that relatively, charges are easier to be injected into the over-erased memory cells than into the memory cells having threshold voltages near the maximum voltage. Thus, as shown in FIG. 8B, the threshold voltages of the memory cells which are distributed near the minimum voltage are positively shifted to narrow the threshold voltage distribution.

In the soft-program verification, a pass voltage VPASSR (e.g., 4.5 V as listed in the example of FIG. 5), which is applied to non-selected word lines in reading, is applied to all word lines in the selected block (step S204). As in the case of the erase verification, the pre-charge circuit 180 is used for charging, and the same bias voltage is applied to the selection gate lines SGD and SGS in such verification. Then, the sensing circuit 170 is used to detect whether the current of the bit lines is below the threshold current (i.e., Id<1 μA?), and if the result is "yes", the soft programming is determined to be successful (step S206). That is to say, when the sensing node SN depicted in FIG. 4 outputs a lower voltage, the program operation is determined to be qualified. If the soft programming is determined to be unsuccessful, the soft programming is performed one more time (step S208). At this time, a soft-program voltage Vsoft2 higher than the previous soft-program voltage Vsoft1 is applied to the unqualified bit lines. In the meantime, the bit lines whose soft programming is determined to be successful is provided with, for example, a write protection voltage obtained by a boost operation using a boost circuit. By doing so, the threshold voltages of the memory cells corresponding to the unqualified bit lines are positively shifted. The soft programming and the verification are repeated until all bit lines are qualified (step S210). Finally, the current of each bit line of the block whose soft programming is ended is converged toward about 1 μA. In addition, FIG. 8C illustrates the threshold voltage distribution in the program verification. For instance, when 1.5 V is applied to the selected word line, the current Id of the bit line is lower than 0.15 μA.

With this embodiment, the minimum voltage of the threshold voltage distribution may be positively shifted to narrow the threshold voltage distribution of the memory cells. Thus, the maximum of the current provided from the sensing circuit via the bit line in reading can be limited to suppress the power consumption. Specifically, in the soft-program verification, the pass voltage VPASSR, which is applied to non-selected word lines in reading, is applied to all word lines, and the bit lines with currents lower than the threshold current are detected and determined to be qualified, so that the maximum current provided from the sensing circuit in the reading is suppressed. This also relates to miniaturization of the sensing circuit. Meanwhile, because the pre-charge voltage is provided at arbitrary places between the NAND strings NU to the bit lines starting from the sensing circuit, the time required for the sensing circuit to charge the bit lines can be significantly reduced, and the read or program operation can be speeded up.

Figure 10:
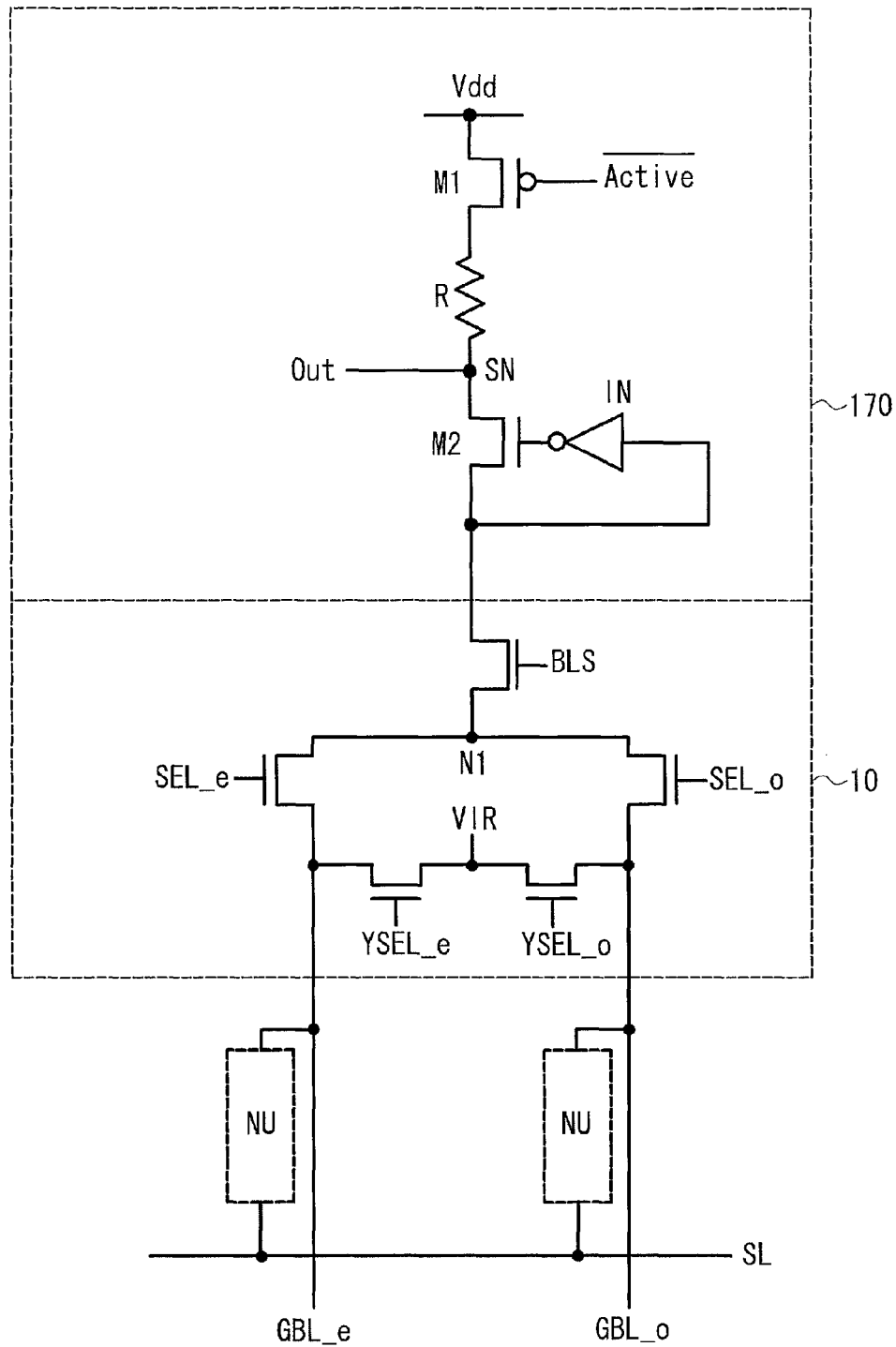
FIG. 10 illustrates another exemplary structure of a flash memory according to an embodiment of the invention.

Although a pair of page buffer/sensing circuits disposed in both the upper and the lower parts of the memory array are exemplarily illustrated in FIG. 2 and each of the page buffer/sensing circuits is electrically connected with the even or odd bit lines, one page buffer/sensing circuit may alternatively be commonly shared by the even bit lines and the odd bit lines. Under such situation, the page buffer/sensing circuit 170 is electrically connected with the even bit line GBL_e and the odd bit line GBL_o selectively via the bit line selection circuit 10, as shown in FIG. 10. Moreover, in the situation where the pair of page buffer/sensing circuits is electrically connected with the even bit lines and the odd bit lines, respectively, as described in this embodiment, a bit line shielding operation may be performed, which makes the odd bit lines have a reference potential, such as GND, when the even bit lines are being read and makes the even bit lines have the reference potential, such as GND, when the odd bit lines are being read.

Though the erase mode described in the above embodiments includes the steps shown in FIG. 6, the erase mode of the invention may further include steps other than those shown in FIG. 6. Additionally, though each memory cell stores one-bit data in the above embodiments, the invention is also applicable to memory cells each storing multi-bit data. Moreover, it is apparent that each of the values mentioned in the above embodiments is merely provided for exemplification.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor memory apparatus, comprising:
a memory array, comprising a plurality of memory cells;
a word line selection circuit, configured to select a row of memory cells;
a current-type sensing circuit, electrically connected with respective bit lines of the memory array to sense a current of a selected bit line; and
an erase unit, configured to erase data of memory cells in a selected block of the memory array and comprising an erase sequence and a soft-program sequence, wherein
the erase sequence comprises an erase verification configured to apply a first bias voltage that is applied to a selected word line in a read operation to all word lines in the erased block and determine whether a current of each bit line of the erased block is larger than a first value, and ends the erasure if the result is yes; and
the soft program sequence comprises a soft-program verification configured to apply a second bias voltage that is applied to non-selected word lines in the read operation to all the word lines in the erased block and determine whether the current of each bit line is lower than a second value which is lower than the first value, and ends the soft programming if the result is yes.

2. The semiconductor memory apparatus according to claim 1, wherein the soft-program sequence applies a write protection voltage to the bit lines whose currents are lower than the second value, and performs the soft programming on the memory cells connected with the bit lines whose currents are larger than the second value.

3. The semiconductor memory apparatus according to claim 1, further comprising a plurality of pre-charge circuits supplying a pre-charge voltage to each of the bit lines and disposed between the blocks.

4. The semiconductor memory apparatus according to claim 3, wherein each of the pre-charge circuits provides the pre-charge voltage to the bit lines before supplying the currents to the bit lines through the sensing circuit.

5. The semiconductor memory apparatus according to claim 3, wherein the sensing circuit comprises a first sensing circuit electrically connected with even bit lines and a second sensing circuit electrically connected with odd bit lines, wherein the first sensing circuit is disposed beside one end of the memory array, the second sensing circuit is disposed beside the other end of the memory array, and the plurality of pre-charge circuits is disposed between the first sensing circuit and the second sensing circuit.

6. The semiconductor memory apparatus according to claim 3, wherein each of the pre-charge circuits comprises a conductive line extending in a row direction of the memory array from the word line selection circuit and electrically connected with the bit lines.

7. A method for erasing a semiconductor memory apparatus having NAND non-volatile memory cells, comprising:
an erase sequence, comprising an erase verification configured to apply a first bias voltage that is applied to a selected word line in a read operation to all word lines in the erased block and determine whether a current of each bit line of an erased block is larger than a first value, and ending the erasure if the result is yes; and a soft-program sequence, comprising a soft-program verification configured to apply a second bias voltage that is applied to non-selected word lines in the read operation to all the word lines of the erased block and determine whether the current of each bit line is smaller than a second value which is smaller than the first value, and ending the soft programming if the result is yes.

8. The method according to claim 7, wherein the soft-program sequence applies a write protection voltage to the bit lines whose currents are smaller than the second value, and performs the soft programming on the memory cells electrically connected with the bit lines whose currents are larger than the second value.

\* \* \* \* \*